(12) United States Patent
Mackh et al.

(10) Patent No.: US 8,785,234 B2
(45) Date of Patent: Jul. 22, 2014

(54) METHOD FOR MANUFACTURING A PLURALITY OF CHIPS

(71) Applicant: Infineon Technologies AG, Neubiberg (DE)

(72) Inventors: Gunther Mackh, Neumarkt (DE); Adolf Koller, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/665,501

(22) Filed: Oct. 31, 2012

(65) Prior Publication Data

US 2014/0117505 A1 May 1, 2014

(51) Int. Cl.
*H01L 21/00* (2006.01)

(52) U.S. Cl.
USPC ............. 438/69; 438/113; 438/460; 257/618; 257/642

(58) Field of Classification Search
USPC ............ 438/69, 113, 460, 759; 257/618, 620, 257/642, E23.179
See application file for complete search history.

(56) References Cited

U.S. PATENT DOCUMENTS

| | | | |
|---|---|---|---|
| 5,604,761 A * | 2/1997 | Seki et al. | 372/43.01 |
| 2006/0082003 A1* | 4/2006 | Shizuno | 257/787 |
| 2006/0291369 A1* | 12/2006 | Yoon et al. | 369/288 |
| 2007/0170159 A1 | 7/2007 | Fukumitsu | |
| 2009/0174018 A1 | 7/2009 | Dungan et al. | |
| 2012/0211748 A1 | 8/2012 | Miccoli et al. | |
| 2012/0214278 A1* | 8/2012 | Nakata et al. | 438/113 |
| 2012/0267351 A1 | 10/2012 | Huang | |

OTHER PUBLICATIONS

Iwai, H., "Formation of Heat Resistant Ni Silicide Using Metal Additive for Nanoscale CMOS," Master Thesis, Iwai Laboratory, Dept. of Advanced Applied Electronics, 04M36421, 98 pages.
Hamamatsu, "Stealth Dicing Technology and Applications," Hamamatsu Photonics K.K., Technical Information, Mar. 2005, 8 pages.

* cited by examiner

*Primary Examiner* — Phuc Dang
(74) *Attorney, Agent, or Firm* — Slater & Matsil, L.L.P.

(57) ABSTRACT

A method for manufacturing a plurality of chips comprises the step of providing a wafer comprising a plurality of chip areas separated by one or more dicing lines, wherein the chip areas are arranged on a first main surface, the step of providing a laser absorption layer on a second main surface opposite to the first main surface and the step of providing a backside metal stack on the laser absorption layer. After that a laser light is applied to the laser absorption layer along the dicing lines before the chips are singulated along the dicing lines by using stealth dicing.

24 Claims, 3 Drawing Sheets

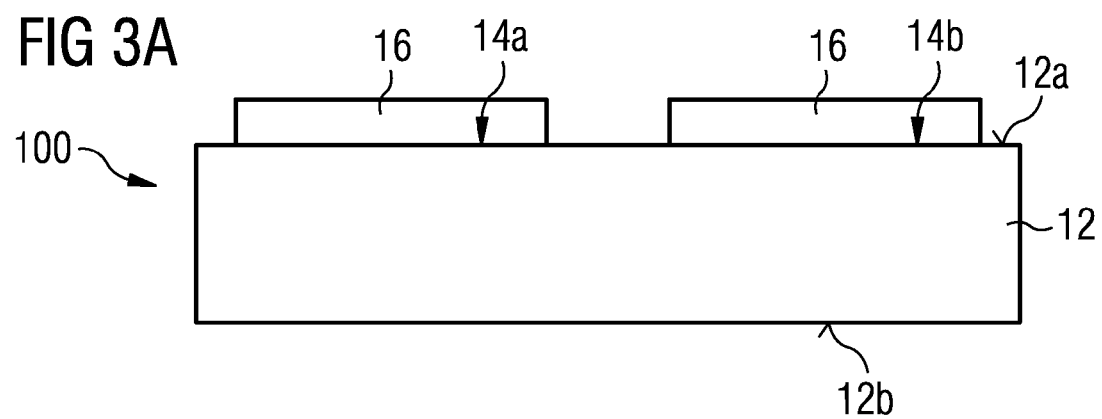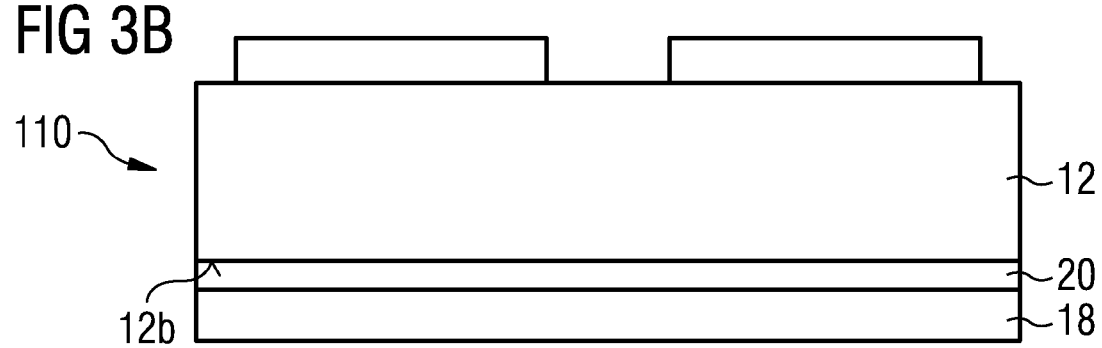

METHOD FOR MANUFACTURING A PLURALITY OF CHIPS

TECHNICAL FIELD

Embodiments of the present invention refer to a method for manufacturing a plurality of chips, to a chip comprising a backside metal stack and to a wafer comprising a plurality of chip areas.

BACKGROUND

In a common manufacturing process of semiconductor devices a plurality of chips are manufactured in parallel. Here, the chip layout of the plurality of chips is patterned onto a wafer such that the singular chip areas are arranged side by side on the wafer and such that a semiconductor structure comprising integrated circuits (ICs) is formed in each chip area. The chip areas are separated by a scribeline line, also referred to as dicing line, which is typically metal free. At the end of this so called frontend process the wafer is cut or diced along the dicing lines in order to singulate the chips. This can, for example, be done by using a saw or by using stealth dicing (laser dicing).

SUMMARY OF THE INVENTION

Embodiments of the invention provide a method for manufacturing a plurality of chips comprising the step of providing a wafer comprising a plurality of chip areas separated by one or more dicing lines, wherein the chip areas are arranged on a first main surface, the step of providing a laser absorption layer on a second main surface opposite to the first main surface and the step of providing a backside metal stack on the laser absorption layer. After that a laser light is applied to the laser absorption layer along the dicing lines before the chips are singulated along the dicing lines by using stealth dicing.

A further embodiment provides a method for manufacturing a plurality of chips comprising the step of providing a wafer comprising a plurality of chip areas separated by one or more dicing lines, wherein the chip areas are arranged on a first main surface, the step of depositing a laser absorption layer on a second main surface opposite to the first main surface and the step of providing a backside metal stack on the laser absorption layer. After that a laser light is applied to the first main surface, wherein the laser light is focused on or above the laser absorption layer at least along the dicing lines, wherein the laser light causes a local restraint of the laser absorption layer. The local restraint inserts a predetermined breaking point into the backside metal stack. The last step is singulating the chips along the dicing lines by using stealth dicing.

Further embodiments provide a chip comprising a substrate and a backside metal stack, wherein a laser absorption layer is arranged between the substrate and the backside metal stack. An area comprising a laser illumination reaction product of a material of the substrate and of a material the laser absorption layer is formed between the substrate and laser absorption layer, and wherein the reaction product is arranged at least along dicing edges of the chip.

A further embodiment provides a chip comprising a substrate and a backside metal stack, wherein a laser absorption layer is arranged between the substrate and the backside metal stack, and wherein a thickness of the laser absorption layer is reduced along dicing edges surrounding the chip.

A further embodiment provides a wafer comprising a plurality of chip areas separated by one or more dicing lines which is smaller than 70 µm, wherein the wafer comprises a backside metal stack. Here, the laser absorption layer is arranged between a main surface and the backside metal stack.

BRIEF DESCRIPTION OF THE DRAWINGS

In the following, embodiments of the invention will be described referring to the drawings, wherein:

FIGS. 3a to 3e show a schematic flow chart of the method for manufacturing a plurality of chips comprising a laser absorption layer according to an embodiment.

DETAILED DESCRIPTION OF ILLUSTRATIVE EMBODIMENTS

Figure 1:
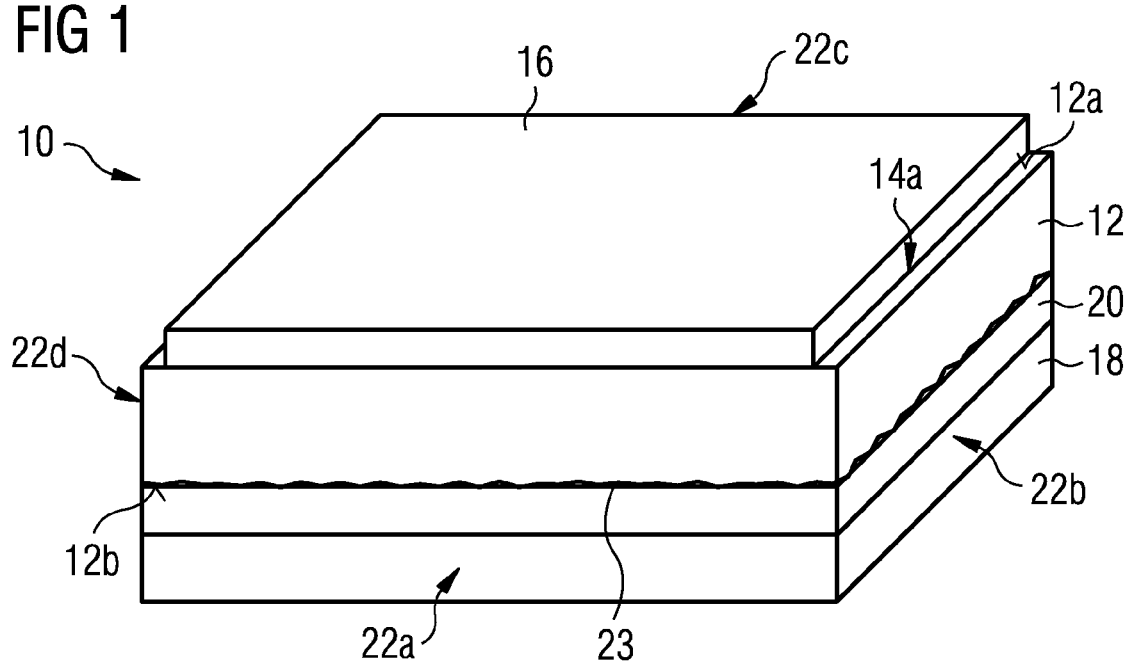
FIG. 1 shows a schematic cross sectional view of a chip comprising a laser absorption layer according to an embodiment.

Different embodiments of the invention will subsequently be discussed referring to FIGS. 1 and 3. In the drawings, identical reference numerals are provided to objects having identical or similar functions so that objects referred to by identical reference numerals within the different embodiments are interchangeable and the description thereof is mutually applicable.

Below, a method for singulating a plurality of chips patterned on a wafer, namely the so called stealth dicing process will be discussed together with its weaknesses before discussing embodiments of the invention. Stealth dicing is a laser based technique which achieves high quality sidewalls in silicon and high silicon efficiency (small width of the dicing line). Furthermore, besides the increased silicon efficiency the process time of stealth dicing is reduced when compared to saw dicing. So, for a wafer having an exemplary thickness of 100 µm a scribeline width of 40 µm or less should be sufficient. A distinction is made between frontside stealth dicing (directing the laser to the frontside) and backside stealth dicing (directing the laser to the backside).

The first step of the two stage process is directing a laser beam on the substrate and scanning the beam along the dicing line such that defect regions are introduced into the substrate. Here, a pulsed Nd:YAG laser is typically used which operates at a frequency of 1064 nm, 1080 nm (fiber laser) or 1342 nm (frequency range between 950 nm and 1400 nm). During the multiple scans of the laser beam along the dicing lines the defect regions are inscribed in different depths of the wafer by focussing the laser beam at the different depths. Due to the defect regions arranged along the dicing lines in different depths a kind of predetermined breaking point is generated. The next step of the two stage stealth dicing process is manufacturing the wafer along the dicing lines. Here, the wafer is typically attached to a carrier membrane which is radially expandable. Due to the expansion a mechanical loading is applied to the wafer such that the wafer is fractured along the dicing lines weakened via the provide defect regions. This singulating method enables an improved rate of yield of the wafer due to the smaller cut-off at the scribeline when compared to wafer sawing.

However, a backside metal stack (provided to one of the main surfaces) affects the stealth dicing process due to the high elasticity and the reflection of the laser used for stealth dicing and may require a wider scribeline. For example, backside metal stack may lead to pure chipping quality after the mechanical dicing. Further, ablation laser processing may lead to redeposition of metal compounds on the chip sidewall. Thus patterning of backside metal prior to a chip separation is complicated and expensive. Thick metal layer stacks are even not able to be separated. However, there is a trend to thinner thicknesses, e.g., for power technologies, with backside metal. The thinner thickness of the wafer or the substrate enables a smaller dicing line which, in particular, is feasible by using stealth dicing. Therefore, there is a need for an improved approach which enables stealth dicing in combination with backside metal as well as a high level of processing reliability. Below, this improved approach will be discussed.

FIG. 1 shows a chip 10 comprising a substrate 12, wherein the substrate 12 (e.g., a silicon substrate) comprises a chip area 14 on the first main surface 12a. A semiconductor structure 16 may be provided to the chip area 14 such that same comprises at least one integrated circuit. Further, the chip 10 comprises a backside metal stack 18 which is arranged on a second side 12b opposite to the first side (c.f. first main surface 12a). Between the backside metal stack 18, which may comprise one or more metal layers, and the substrate 12 a laser absorption layer 20 is arranged at a second main surface 12b (opposite to the main first main surface 12a) in order to overcome the restriction of laser stealth dicing. The laser absorption layer 12, which may comprise a silicide, e.g., silicon carbide (SiC), cobalt silicon (CoSi) or other silicide comprising titanium (Ti), nickel (Ni) or molybdenum (Mo), is arranged for the purpose of manufacturing.

The laser absorption layer 20 leads to an improved separation of the backside metal stack 18 when using stealth dicing for singulating a plurality of chips patterned on a wafer. Therefore, the laser absorption layer 18 is at least provided between the backside metal stack 18 and the substrate 12 in an area adjacent to dicing edges 22a, 22b, 22c and 22d, along which the chip 10 has been separated from the other chips produced simultaneously. Preferably, the laser absorption layer 18 is completely provided to the second entire main surface. In order to avoid providing an isolation between the substrate 12 and the backside metal stack 18 the laser absorption layer 20 is conductive and has preferably a low resistivity. It should be noted that the resistivity of the laser absorption layer 20 may be higher when compared to the backside metal stack 18. Thus, the laser absorption layer 20 is as thin as possible.

The laser absorption layer 20 has the purpose to integrate a predefined breaking point to the metal layer stack 18 when the laser absorption layer 20 is radiated by a laser, e.g., an infrared laser. Therefore, same is configured to absorb a laser having a wavelength, for example, in a range of 1000 nm and 1100 nm. The integration of this predetermined breaking point (along the dicing lines, (c.f. dicing edges 22a, 22b, 22c and 22d) in the metal layer stack 18 is based on the principle that a volume change of the laser absorption layer 20 may be induced by a thermal impact caused by the laser radiation. Due to the volume change of the laser absorption layer 20, the backside metal stack 18 is deformed and, thus, the predetermined breaking point is integrated to the backside metal stack 18. As a consequence of this there are no chipping or ablation effects along one of the dicing edges 22a to 22d (surrounding the chip area 14) anymore.

Due to the thermal impact to the laser absorbing layer 20 and the substrate 12, a laser illumination reaction product 23 of the substrate 12 and the laser absorption layer 20 may be generated along the dicing edges 22a to 22d. This laser illumination reaction product 23 comprises the material of the laser absorption layer 20 and the substrate 12, e.g., a combination of silicon and cobalt silicon or a reaction of silicon and titanium.

Figure 2:
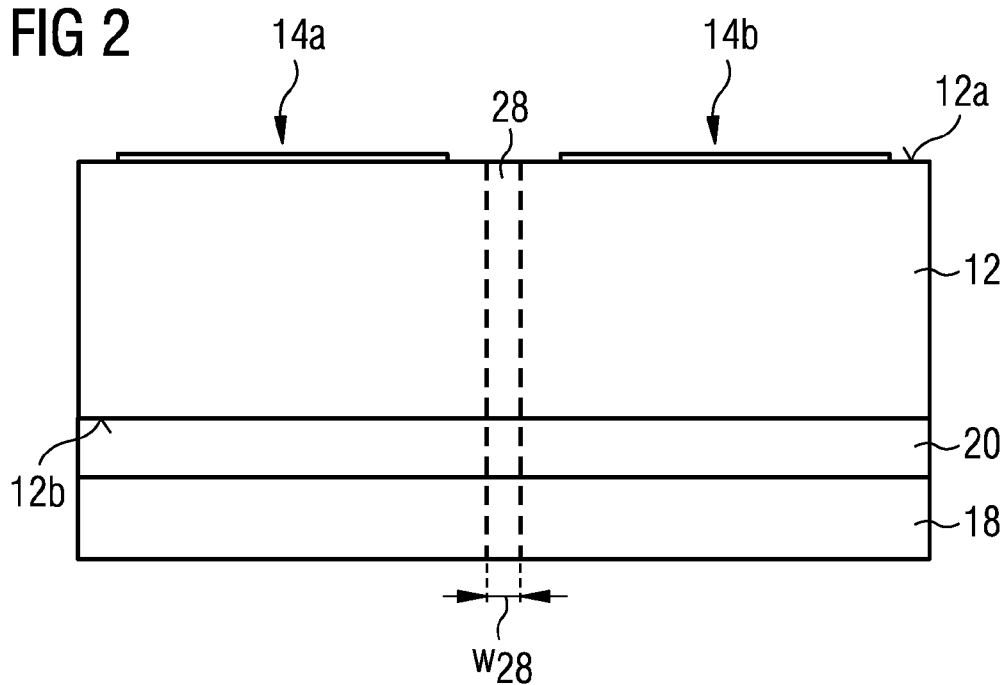
FIG. 2 shows a schematical cross sectional view of a substrate comprising at least two chip areas separated by dicing lines and a backside metal stack according to an embodiment.

FIG. 2 shows a wafer 12 (c.f. substrate) which has a plurality of chip areas 14a and 14b at the first main surface 12a. Furthermore, the wafer 12 comprises the above discussed backside metal stack 18 arranged at a second side (c.f. second main surface 12b), wherein the laser absorption layer 20 is sandwiched between the wafer 12 and the backside metal stack 18. The dicing line 28, which forms the two dicing edges (c.f. 22a to 22d) after separating the chips, is illustrated between the two chip areas 14a and 14b. A width $w_{28}$ of the dicing line 28 may, for example, is smaller than 50 μm or smaller than 30 μm or even smaller than 20 μm so that the slice of the wafer 12 may be reduced. Please note that the laser absorption layer 20 does not necessarily extend over the whole wafer 12 because it is sufficient that the laser absorption layer sandwiched between the metal stack 18 and the substrate 12 is arranged in the area of dicing line 28. Below, the method for singulating the shown two chip areas 14a and 14b will be discussed referring to FIGS. 3a to 3e.

FIG. 3a shows a first step 100 of the method for manufacturing a plurality of chips. In this first step 100 the substrate 12 is frontside processed in the chip areas 14a and 14b such that the semiconductor structure 16 (BEOL stack, back end of line stack) is provided to the first main surface 12a. Optionally for thin wafers 12 a carrier may be mounted on the frontside (c.f. first main surface 12a) in order to improve the handling for the next process steps. This step 100 may comprise the optional step of backside grinding (c.f. second main surface 12b) in order to increase the surface rawness and the optional step of stress relief before providing the backside layers 18 and 20.

FIG. 3b illustrates the next step 110 for providing the two backside layers, namely the laser absorption layer 20 and the backside metal stack 18. The providing of the laser absorption layer 20 to the second main surface 12b may be performed by deposition, e.g., deposition of a non-reacted material like titanium. Preferably, the material of the laser absorption layer 20 is selected such that no further volume change or phase change under the maximum assembly temperature impact of the backend process may be caused (e.g., soldering temperature). Furthermore, the step 110 may comprise an optional step 110 of annealing the laser absorption layer 20 before providing the backside metal stack 18 in order to ensure the temperature capability of the carrier process (backend process). This annealing may cause a phase change or locally limited phase change of the laser absorption layer 20. Especially, the laser anneal is recommended to ensure the capability with the FE process. Here, besides the type of the annealing process the type of the used silicide formation of the laser absorption layer 20 is a further factor of influence. After that the backside metal stack 18 may be provide to the laser absorption layer 20, for example, by deposition.

Figure 3C:
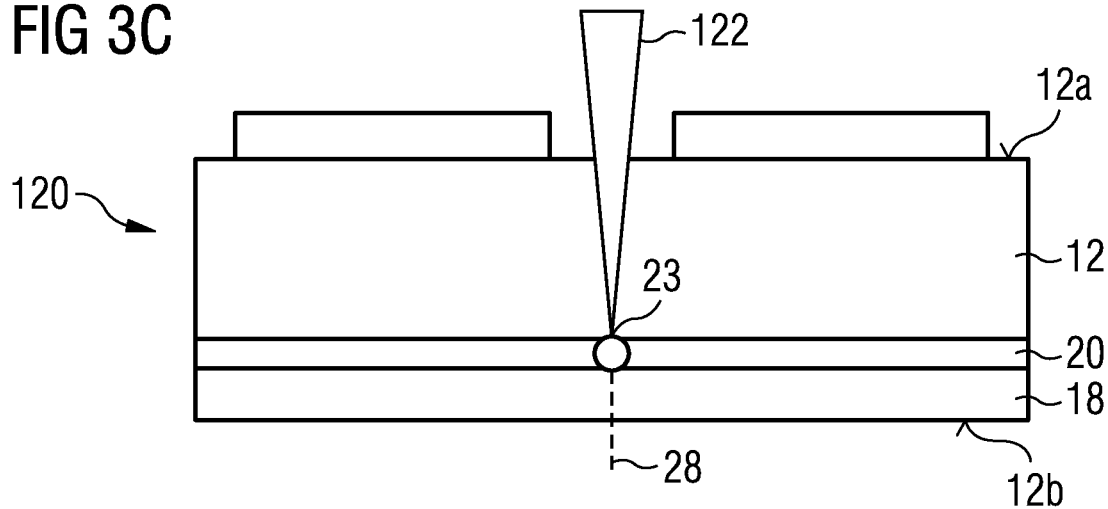

FIG. 3c shows the step 120 of applying the laser light 122 to the frontside 12a and focus the laser beam 122 to the laser absorption layer 20 or above same. So, applying the laser light 122 to the laser absorption layer 20 means that the laser beam 122 may preferably, but does not necessarily have to be directed exactly to the laser absorption layer 20 because it is sufficient to direct the laser beam 122 to a vicinity of the absorption layer 20 (e.g., above). Note that this step 120 may be performed preferably after mounting the wafer 12 on a tape and on a carrier membrane (not shown), respectively, with its backside 12b or, in more detail, via the backside metal stack 18.

During the step 120, the laser beam 122 is scanned along the one or more dicing lines 28 such that a plastic volume change (e.g., local restraint) along the one or more dicing lines may be caused. Therefore, the radiation of the laser beam 122 may be performed such that the melting point of the respective material of the laser absorption layer 20 may be reached (e.g., 1470° C. for a silicide comprising titanium (TiSi$_2$), approx. 900° C. for cobalt silicon (CoSi$_2$), or approx. 500° C. for a silicide comprising nickel (NiSi). The volume change, or in more detail, the volume reduction of the laser absorption layer 20 is caused due to the fact that the laser absorption layer 20 has a significantly higher absorption rate of infrared laser light and a higher coefficient of thermal expansion, e.g., at least 20% higher, when compared to the substrate 12 in which just defect regions are caused by the same laser beam 22 so that the radiations leads to a change of the macromolecular material structure in the laser absorption layer 20. Note if the optional carrier (for thin wafers) has been provided to the front side of the substrate 12 during step 100, same may be demounted before radiating the absorbing layer 20.

Figure 3D:
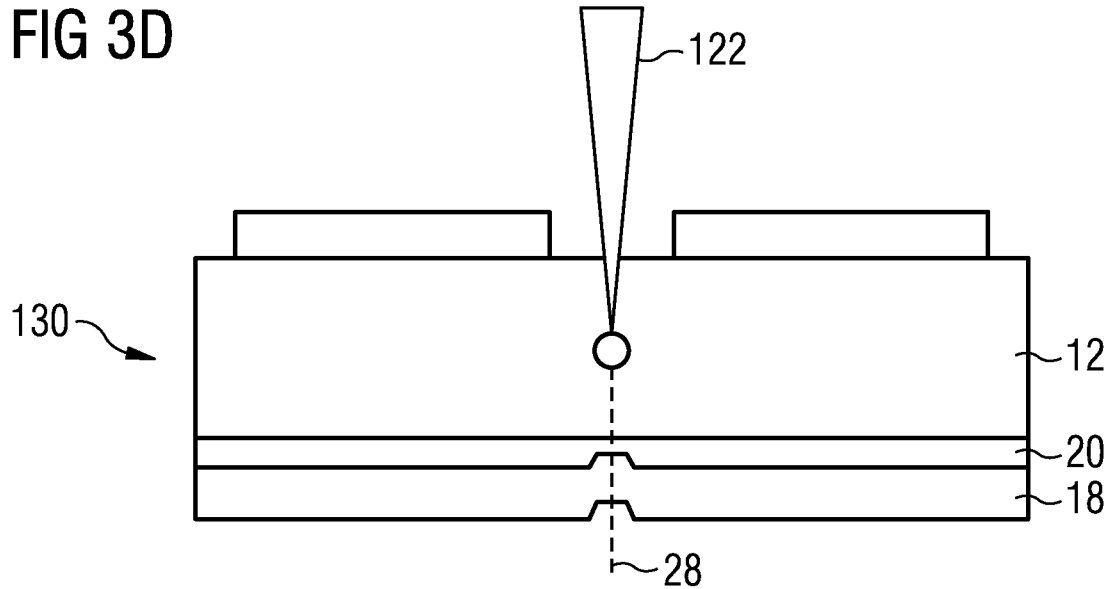

Due to the above discussed volume change (shrinking) of the laser absorption layer 20 the shape of same and, thus, the shape of the backside metal stack 18 may be changed. For example, the thickness of the laser absorption layer 20 may be reduced along the dicing edges 22a to 22d (e.g., by at least 10 or even 30%, when compared to the thickness of the layer 20 in the middle of the chip 10) such that the metal layer stack 18 may be deformed due to the reduced thickness along the dicing lines 28. The deformation is illustrated by FIG. 3d. Further, a reaction between the substrate 12 and the laser absorption layer 20 may be caused at least in a portion adjacent to the dicing line 28 due to the high temperatures while radiating the laser beam 22 to the laser absorption layer 20. Consequently, a laser illumination reaction product 23, e.g., titanium silicon (TiSi) or Nickel silicon (NiSi) may be formed in this portion.

FIG. 3d illustrates the volume reduction of the laser absorption layer 20 in the area of the dicing line 28. As can be seen, the metal layer stack 18 is mechanically deformed in the area of the dicing line 28. This leads to a predetermined breaking point of the metal layer stack 18. Furthermore, FIG. 3d illustrates the step 130 of repeating the laser scans 122 in a depth of the substrate 12 in order to provide the defect regions (e.g., 10 μm defect regions) into the substrate 12. Note that the order of the steps 120 and 130 may, alternatively, be changed.

Figure 3E:
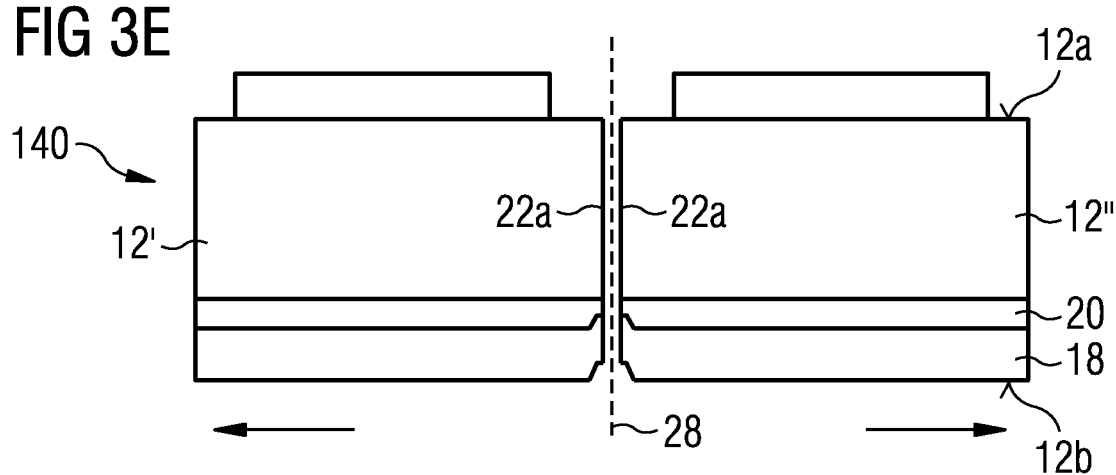

The next step 140 illustrated by FIG. 3e is the expansion of the wafer 12 (wafer 12' and 12") for singulating the plurality of chips. Due to the (preferably radially) expansion the wafer 12 is separated along the dicing line 28 such that substantially straight dicing edges 22a are generated. As can be seen, the dicing edges 22a are substantially perpendicular to the main surfaces 12a and 12b due to the provided defect regions into the substrate 12 and due to the deformation of the metal layer stack 18 caused by the volume change of the laser absorption layer 20. Optionally, this process step 140 may be supported by using a breaking bar.

The last step (not shown) is the relamination of the singulated chips on target frame size (cf. substrates 12' and 12").

What is claimed is:

1. A method for manufacturing a plurality of chips, the method comprising:
    providing a wafer comprising a plurality of chip areas separated by one or more dicing lines, wherein the chip areas are arranged on a first main surface;
    providing a laser absorption layer on a second main surface opposite to the first main surface;
    providing a backside metal stack on the laser absorption layer;
    applying laser light to the laser absorption layer along the dicing lines; and
    singulating the chips along the dicing lines by using stealth dicing, wherein the laser light causes a volume change of the laser absorption layer, and wherein the volume change inserts a predetermined breaking point into the backside metal stack.

2. The method according to claim 1, wherein the laser absorption layer is radiated by the laser light in order to perform the volume change of the laser absorption layer.

3. The method according to claim 1, wherein applying laser light to the laser absorption layer causes a local restraint of the laser absorption layer.

4. The method according to claim 1, wherein the laser light is directed on the first main surface and focused up to a depth of the laser absorption layer along the dicing lines.

5. The method according to claim 1, wherein providing the laser absorption layer comprises depositing the laser absorption layer.

6. The method according to claim 1, further comprising annealing the laser absorption layer before providing the backside metal stack.

7. The method according to claim 1, wherein a laser outputting the laser light operates in a range between 950 nm and 1400 nm.

8. The method according to claim 1, wherein applying laser light to the laser absorption layer forms an area comprising a laser illumination reaction product of the wafer and the laser absorption layer.

9. The method according to claim 1, further comprising providing a semiconductor structure comprising at least an integrated circuit on the chip area of the first main surface before providing the laser absorption layer.

10. A method for manufacturing a plurality of chips, the method comprising:
    providing a wafer comprising plurality of chip areas separated by one or more dicing lines, wherein the chip areas are arranged on a first main surface;
    depositing a laser absorption layer on a second main surface opposite to the first main surface;
    providing a backside metal stack on the laser absorption layer;
    applying laser light to the first main surface, wherein the laser light is focused on or above the laser absorption layer at least along the dicing lines, wherein the laser light causes a local restraint of the laser absorption layer, and wherein the local restraint inserts a predetermined breaking point into the backside metal stack; and
    singulating the chips along the dicing lines by using stealth dicing.

11. A method for manufacturing a plurality of chips, the method comprising:
    providing a wafer comprising a plurality of chip areas separated by one or more dicing lines, wherein the chip areas are arranged on a first main surface;
    providing a laser absorption layer on a second main surface opposite to the first main surface;
    providing a backside metal stack on the laser absorption layer;
    applying laser light to the laser absorption layer along the dicing lines; and
    singulating the chips along the dicing lines by using stealth dicing, wherein applying laser light to the laser absorption layer causes a local restraint of the laser absorption layer.

12. The method according to claim 11, wherein the laser light is directed on the first main surface and focused up to a depth of the laser absorption layer along the dicing lines.

13. The method according to claim 11, wherein providing the laser absorption layer comprises depositing the laser absorption layer.

14. The method according to claim 11, further comprising annealing the laser absorption layer before providing the backside metal stack.

15. The method according to claim 11, wherein a laser outputting the laser light operates in a range between 950 nm and 1400 nm.

16. The method according to claim 11, wherein applying laser light to the laser absorption layer forms an area comprising a laser illumination reaction product of the wafer and the laser absorption layer.

17. A method for manufacturing a plurality of chips, the method comprising:
providing a wafer comprising a plurality of chip areas separated by one or more dicing lines, wherein the chip areas are arranged on a first main surface;
providing a laser absorption layer on a second main surface opposite to the first main surface;
providing a backside metal stack on the laser absorption layer;
annealing the laser absorption layer before providing the backside metal stack;
applying laser light to the laser absorption layer along the dicing lines; and
singulating the chips along the dicing lines by using stealth dicing.

18. The method according to claim 17, wherein the laser light is directed on the first main surface and focused up to a depth of the laser absorption layer along the dicing lines.

19. The method according to claim 17, wherein a laser outputting the laser light operates in a range between 950 nm and 1400 nm.

20. The method according to claim 17, wherein applying laser light to the laser absorption layer forms an area comprising a laser illumination reaction product of the wafer and the laser absorption layer.

21. A method for manufacturing a plurality of chips, the method comprising:
providing a wafer comprising a plurality of chip areas separated by one or more dicing lines, wherein the chip areas are arranged on a first main surface;
providing a laser absorption layer on a second main surface opposite to the first main surface;
providing a backside metal stack on the laser absorption layer;
applying laser light to the laser absorption layer along the dicing lines; and
singulating the chips along the dicing lines by using stealth dicing, wherein applying laser light to the laser absorption layer forms an area comprising a laser illumination reaction product of the wafer and the laser absorption layer.

22. The method according to claim 21, wherein the laser light is directed on the first main surface and focused up to a depth of the laser absorption layer along the dicing lines.

23. The method according to claim 21, wherein a laser outputting the laser light operates in a range between 950 nm and 1400 nm.

24. The method according to claim 21, wherein the laser light is directed on the first main surface and focused up to a depth of the laser absorption layer along the dicing lines.

* * * * *